United States Patent
Mortensen et al.

(10) Patent No.: US 9,847,789 B1
(45) Date of Patent: Dec. 19, 2017

(54) HIGH PRECISION SAMPLED ANALOG CIRCUITS

(71) Applicant: Analog Devices, Inc., Norwood, MA (US)

(72) Inventors: Mikael Mortensen, Cambridge, MA (US); Eric G. Nestler, Long Beach Township, NJ (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/451,776

(22) Filed: Mar. 7, 2017

(51) Int. Cl.
*H03M 1/12* (2006.01)
*H03M 1/00* (2006.01)
*H03M 1/80* (2006.01)

(52) U.S. Cl.
CPC .......... *H03M 1/1245* (2013.01); *H03M 1/00* (2013.01); *H03M 1/12* (2013.01); *H03M 1/804* (2013.01)

(58) Field of Classification Search
CPC .......... H03M 1/804; H03M 1/00; H03M 1/12
USPC ............. 341/172, 150, 118, 155, 156, 120
See application file for complete search history.

(56) References Cited

U.S. PATENT DOCUMENTS

| | | | |
|---|---|---|---|
| 4,077,035 A | 2/1978 | Yee | |
| 6,906,653 B2 | 6/2005 | Uno | |
| 7,173,552 B1 | 2/2007 | Garcia | |
| 7,479,910 B1 | 1/2009 | Heinks et al. | |
| 8,547,272 B2 * | 10/2013 | Nestler | H03H 15/02 341/155 |
| 2010/0207644 A1 | 8/2010 | Nestler et al. | |
| 2014/0233773 A1 | 8/2014 | Nestler et al. | |

OTHER PUBLICATIONS

Vincent Vanhoucke et al., *Improving the speed of neural networks on CPUs*, Dec. 28, 2011, Retrieved from http://hgpu.org/?p=6760, 12 pages.
Edward H. Lee et al., *A 2.5GHz 7.7TOPS/W Switched-Capacitor Matrix Multiplier with Co-designed Local Memory in 40nm*, ISSCC 2016 / Session 24 / Ultra-Efficient Computing: Application-Inspired and Analog-Assisted Digital, © 2016 IEEE International Solid-State Circuits Conference, 3 pages.
Ravi Shankar Gaddam, *A 10-Bit Dual Plate Capacitive DAC With Auto-Zero On-Chip Reference Voltage Generation*, A Thesis Presented to the Graduate Faculty of The University of Akron, 120 pages.
Professor Y. Chiu, *DAC Architecture*, Data Converters EECT 7327, Fall 2014, 30 presentation slides.

(Continued)

*Primary Examiner* — Joseph Lauture
(74) *Attorney, Agent, or Firm* — Patent Capital Group

(57) ABSTRACT

A sampled analog circuit is divided into at least two segments, each segment receiving sampled analog data and a respective subset of bits of a filter coefficient. The at least two segments can have digital-to-capacitance circuits with substantially identical ranges of capacitance values. One or more outputs from the segments can be scaled to reflect a position of the subset of bits in the bits of the filter coefficient, and thereafter added in the analog domain to produce a filtered output signal that may then be digitized. Alternatively, the outputs from the segments may be digitized before being scaled and/or added in the digital domain.

20 Claims, 12 Drawing Sheets

(56) References Cited

OTHER PUBLICATIONS

Chapter 3: Hardware Multiply/Accumulate (MAC) Unit, Motorola, MCF5307 User's Manual, Retrieved from http://turbo-cf.narod.ru/docs/MCF5307/MCF5307BUM-MAC.pdf, 6 pages.

Yan Zhu et al., *Split-SAR ADCs: Improved Linearity With Power and Speed Optimization*, IEEE Transactions on Very Large Scale Integration (VLSI) Systems, vol. 22, No. 2, Feb. 2014, 12 pages.

\* cited by examiner

HIGH PRECISION SAMPLED ANALOG CIRCUITS

FIELD OF THE DISCLOSURE

The invention relates to systems and methods for processing of analog signals and more particularly for increasing the resolution, speed and noise performance of sampled analog circuits based on switched capacitor circuits.

BACKGROUND

Sampled analog technology is a technique for processing analog input data by a mix of switched capacitor circuits and amplifiers. Directly processing analog signals without intermediate conversion to digital signals can reduce circuit resources compared to use of a digital arithmetic unit of a digital signal processor. Sampled analog technology can be used in various applications where normally digital processing is used. For instance, sampled analog technology can be used for audio, ultrasound processing, etc.

In sampled analog technology, switched capacitors circuits are employed to implement programmable filters for operating on such analog input data. For sampled analog filter banks, there is a trade-off on the size of the coefficients being used and the area used for the given filter. For sampled analog technology, the predominant area used is for these switched capacitors circuits, as the ratios of capacitors in these switched capacitors circuits are what implement the coefficients used. Because of the area and switches used, creating a sampled analog filter bank with a high precision coefficient is costly in area and power. In some cases, sampled analog systems to process or filter sampled analog input data, have a finite resolution related to the finite area available on a chip for the capacitors. Additionally, since the required chip area in a binary switched capacitor circuit increases exponentially with the number of coefficients and the sampling rate depends on the time required to charge and discharge the capacitors, the capacitance of the capacitors which is proportional to the area taken up on the chip should be kept small. Conversely, smaller capacitors exhibit a larger signal-to-noise (SNR) ratio, which can limit how small the capacitors can be in the circuit design.

BRIEF DESCRIPTION OF THE DRAWINGS

Other features and advantages of the present invention will be more readily apparent upon reading the following description of currently preferred exemplified embodiments of the invention with reference to the accompanying drawing, in which.

DETAILED DESCRIPTION

Figure 1:
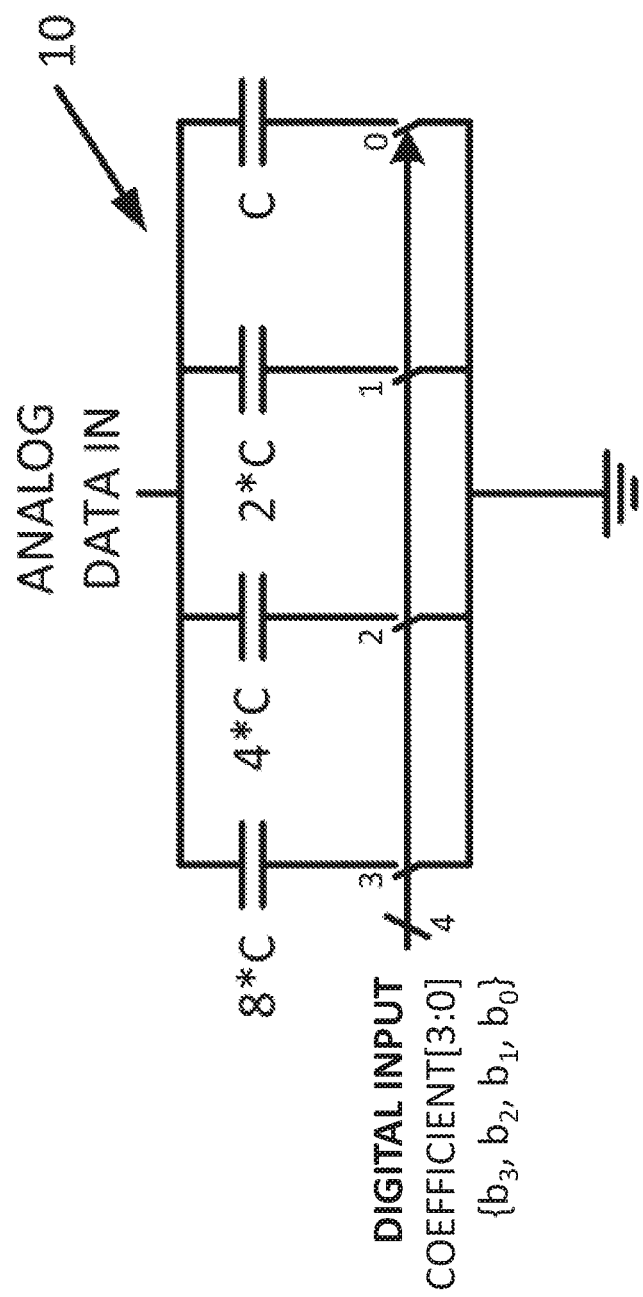
FIG. 1 illustrates a simplified diagram of a digital-to-capacitance circuit according to some embodiments of the disclosure.

A sampled analog circuit is divided into at least two segments, each segment receiving sampled analog data and a respective subset of bits of a filter coefficient. The at least two segments can have digital-to-capacitance circuits with substantially identical ranges of capacitance values. One or more outputs from the segments can be scaled to reflect a position of the subset of bits in the bits of the filter coefficient, and thereafter added in the analog domain to produce a filtered output signal that may then be digitized. Alternatively, the outputs from the segments may be digitized before being scaled and/or added in the digital domain.

Understanding Design Constraints for High Precision Sampled Analog Circuits

In signal processing, operations and filters are implemented in circuitry to process signals to produce other signals for an application. Signal processing is ubiquitous in many electronics applications. Sampled Analog Technology (SAT) refers to systems in which an incoming analog signal is used directly in the system without first being converted to a digital signal. Utilizing sampled analog technology, the signal processing is performed entirely in the analog domain by charge sharing among capacitors, which eliminates the effects of quantization noise and rounding errors and reduces downstream analog-to-digital converter sample rates while also offloading computationally heavy tasks from the digital processor or micro-controller. Using sampled analog technology reduces the power usage for signal processing and can potentially reduce the number of components in the system. Several digital operations and filters can have counter parts in sampled analog technology. Exemplary operations that can be implemented in sampled analog technology include multiply and addition. Exemplary filters that can be implemented in sampled analog technology can include bandpass filters, high pass filters, etc. These filters can be constructed using a finite impulse response (FIR) filter structure, which is characterized by filter coefficients that may be fixed or dynamically adjustable.

In sampled analog technology, digital-to-capacitance circuits are employed to implement operations and filters for operating on such analog input data. A digital-to-capacitance circuit takes a digital input, and outputs or produces a variable capacitance value corresponding to the value of the digital input. Digital-to-capacitance circuits can be considered as a programmable capacitance circuit. The variable capacitance value can be used in sampled analog technology circuits to implement dynamically adjustable charge sharing, for example, to implement a filter with dynamically adjustable filter coefficients for processing the analog signal. With digital-to-capacitance circuits, it is possible to implement an equivalent of a digital multiply (MULT), or digital multiply and accumulate (MAC) in the analog domain (or other filters which utilizes such circuits) where the coefficient is under digital control while the signal processing is kept in the analog domain. The digital-to-capacitance circuits are not to be confused with capacitive digital-to-analog converters (capacitive DACs), which takes a digital input and outputs an variable analog output such as a voltage or a current based on the digital input.

The digital-to-capacitance circuits can include a bank of switched capacitors. The capacitors can be switched in or out of the digital-to-capacitance circuit based on a digital (control) input. Herein, the digital input to the digital-to-capacitance circuit is referred to herein as a coefficient, since the digital input controls the variable capacitance value, which can be used for implementing a coefficient for an operation or a filter in sample analog circuits. Furthermore, the digital input or coefficient has or is represented by a set of bits. The capacitors controllable by the set of bits in the digital-to-capacitance circuit may have exponentially increasing capacitance values, for example increasing as a power of 2, which can implement the least significant bit (LSB) to the most significant bit (MSB) of the digital-to-capacitance circuit. Each capacitor would correspond to a bit in the digital input. The capacitance ratios of these capacitors make it possible to output or produce a variable capacitance value of the digital-to-capacitance circuit based on the provided digital input controlling the switches to the capacitors. The attainable resolution of a digital-to-capacitance circuit, i.e., the resolution attainable for the digital to capacitance conversion (thus the resolution of a filter coefficient), can relate to the number of capacitors in the digital-to-capacitance circuit, since the number of capacitors can correspond to the number of bits (i.e., the digital input or coefficient) that operate the switches in the digital-to-capacitance circuit.

These capacitors are in general implemented as planar capacitors, with the capacitance values being proportional to the area taken up on a semiconductor chip. If the size of the smallest capacitor implementing the least significant bit is kept the same, increasing the resolution of the digital-to-capacitance circuit would mean adding larger capacitors to the digital-to-capacitance circuit to provide more bits. Therefore, the area taken up by the capacitors can increase exponentially with the number of bits of the digital input (i.e., resolution of the digital-to-capacitance circuit). Having a higher resolution digital-to-capacitance circuit, therefore, a higher resolution/precision filter coefficient, would mean more capacitors (generally larger capacitors), and more area on the chip. Creating a sampled analog filter bank with high resolution/precision coefficients can be costly in area and power.

FIG. 1 shows an exemplary simplified digital-to-capacitance circuit 10 switched according to a digital input comprising a set of bits, in this example, a set of four bits, shown as COEFFICIENT[3:0] $\{b_3,b_2,b_1,b_0\}$. The four bits $\{b_3,b_2,b_1,b_0\}$ can represent a (filter) coefficient that the digital-to-capacitance circuit is configured to implement. The digital-to-capacitance circuit produces or provides a variable capacitance value based on the digital input, i.e., the set of bits. The capacitors are provided in parallel, each having a switch that can switch the corresponding capacitor in or out of the circuit.

For sampled analog circuits, when switched in, a capacitor can be coupled to a sampled analog input signal ("ANALOG DATA IN") and ground. In this example, the capacitors have values of $2^n*C$, i.e., in the present example C, $2*C$, $4*C$ and $8*C$, which can be switched in or out of the circuit depending on the settings of switches 0 through 3. The switches 0 through 3 are controlled by parts of the digital input, $b_0$, $b_1$, $b_2$, $b_3$, respectively. For example, a digital input COEFFICIENT[3:0]=$\{0,1,1,1\}$ would result in switching in capacitors having capacitances $4*C$, $2*C$ and C for a total capacitance value of $7*C$ (total capacitance of parallel capacitors is the sum of capacitances of the parallel capacitors).

The rightmost bit $b_0$ in the present example is referred to as the least significant bit (LSB) of the digital input and the leftmost bit $b_3$ is referred to as the most significant bit (MSB) of the digital input. As mentioned above, the capacitor for the MSB in this simple embodiment can use approximately 8 times more surface area on the chip than the capacitor for the LSB.

A digital-to-capacitance circuit controllable by digital input (e.g., COEFFICIENT[N:0]) with a large number of bits to achieve high resolution or high precision processing thus takes up a large area on the chip, namely approximately 2 times the area of the largest capacitor representing the most significant bit (MSB). To increase the resolution of the digital-to-capacitance circuit, i.e., to increase the size of the coefficient or target coefficient resolution, one would normally increase the number of capacitors. Each bit added to the set of bits in the digital input effectively doubles the area of the capacitors on the chip. Accordingly, the required surface area increases exponentially with the number of bits for the digital input. For example, a 10-bit digital-to-capacitance circuit for up to 1024 ($2^{10}$) unique capacitances values would require a capacitor for the MSB that takes up more than 1000 times the surface area on the chip than the capacitor for the LSB. In addition, frequently charging and discharging large capacitors consumes power and takes time. Although the physical size of all capacitors could conceivably be reduced, while maintaining the resolution (i.e., maintain the same capacitance ratios), by decreasing the size of the LSB capacitor, the signal to noise ratio (SNR) for the LSB may limit how small the LSB capacitance can be.

Sampled Analog Multiply Using the Digital-to-Capacitance Circuit

One type of sample analog circuit is a sampled analog multiply circuit (referred herein as SATMULT circuit), which can multiply analog input data by a coefficient that is implemented using the digital-to-capacitance circuit seen in FIG. 1. The digital-to-capacitance circuit can convert the (digital) coefficient into a charge sharing capacitor value equivalent to the value of the coefficient. The SATMULT circuit takes in analog input data and a coefficient as inputs, and generates a product of the analog input data and the coefficient.

Figure 2:
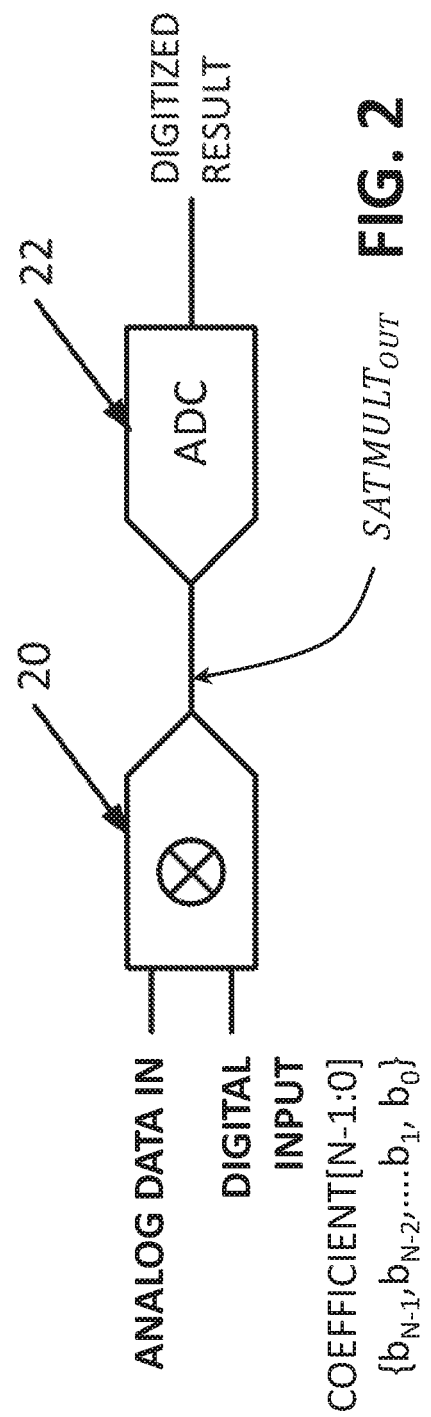
FIG. 2 illustrates a sampled analog multiply circuit (SATMULT) incorporating the digital-to-capacitance circuit of FIG. 1, with an optional downstream analog-to-digital converter (ADC), according to some embodiments of the disclosure.

FIG. 2 shows a simplified exemplary diagram of SAT-MULT circuit 20 which incorporates the digital-to-capacitance circuit 10 of FIG. 1. In this example, SATMULT 20 takes analog input data ("ANALOG DATA IN") and a digital input or coefficient as ("DIGITAL INPUT"). The digital input is shown as COEFFICIENT[N−1:−0], which can have N bits, e.g., $\{b_{N-1}, \ldots b_1, b_0\}$. SATMULT 20 has the digital-to-capacitance circuit illustrated by FIG. 1 which would be controlled by the digital input. The operation of SATMULT 20 can be expressed mathematically by equation (1):

$$SATMULT_{OUT} = \text{COEFFCIENT[SIGN]} * \sum_{n=0}^{N-1} \text{DATA} * \text{COEFFICIENT}[n] * 2^n \qquad (1)$$

wherein $SATMULT_{OUT}$ is the output of SATMULT 20, DATA is the (sampled) analog input data, or "ANALOG DATA IN".

The SATMULT 20 can be used as a building block to form other operations and filters for more complex signal processing. For instance, one or more SATMULT circuits and an adder can be used to implement a sampled analog multiply and accumulate function, which multiplies data and adds the product of the multiplication to an accumulated value. In another instance, parallel SATMULTs and a summation node can be used to implement a finite impulse response (FIR) filter, where the coefficients being provided to the parallel SATMULTs can represent the taps or coefficients of the filter and the analog input data being provided to the parallel SATMULTs can represent the analog input data at various time instants. The SATMULT 20 and various other sampled analog circuits having the SATMULT 20 can be followed by an optional analog-to-digital converter (ADC). As seen in FIG. 2, ADC 22 digitizes the analog output from SATMULT 20, $SATMULT_{OUT}$, to generate a digital output ("DIGITIZED RESULT") for further processing.

Various examples relating to implementations and applications of the SATMULT circuit are described herein. The SATMULT is mentioned herein simply as an exemplary sampled analog circuit, and the disclosure is not intended to be limited to SATMULT circuits only, since other circuits in sampled analog technology having the digital-to-capacitance circuits may leverage the teachings of the disclosure.

Segmenting Target Coefficient Resolution

As explained previously, increasing the resolution, e.g., target coefficient resolution, of the digital-to-capacitance circuit and other sampled analog circuits employing said digital-to-capacitance circuit can be costly in area and power. Designing high precision/resolution sampled analog circuits, such as the SATMULT circuit employing the digital-to-capacitance circuit seen in FIG. 1 or other sampled analog circuits is not trivial. To address some of the issues described herein, it is possible to increase the resolution of a sampled analog circuit based on the digital-to-capacitance circuit seen in FIG. 1 by splitting or segmenting the target coefficient resolution of a digital-to-capacitance circuit into multiple parallel segments having corresponding digital-to-capacitance circuits, whose outputs are later recombined in either the analog or digital domain. The resulting sampled analog circuit can improve the overall resolution and increase the sampling rate and processing speed for sampled analog data while not incurring a penalty or greatly increasing SNR and the physical size of the digital-to-capacitance circuits on a chip.

Consider the example of the SATMULT 20 in FIG. 2 having the digital-to-capacitance circuit of FIG. 1. For instance, suppose the target coefficient resolution is 24 bits. Instead of providing 24 capacitors with exponentially increasing capacitances, e.g., $2^n * C$, where n=0, ... 23, in the digital-to-capacitance circuit to achieve the target coefficient resolution, it is possible to implement two (identical) SATMULT segments, each having a digital-to-capacitance circuit having 12 bits, or 12 capacitors having capacitances $2^n * C$, where n=0, ... 11. Each of the segments would receive a portion/part/subset of the target coefficient resolution. A first segment can implement and receive the "high" part of the coefficient, and a second segment can implement and receive the "low" part of the coefficient. Because the capacitors in the first segment receiving the "high" part of the coefficient are the same as the capacitors in the second segment receiving the "low" part of the coefficient, the output from the first segment would need to be scaled up to compute the multiplication operation of SATMULT properly. An adder can combine a scaled result from the first segment receiving the "high" part of the coefficient and the result from the second segment receiving the "low" part of the coefficient to obtain a final result. In another example, it is possible to implement four segments, i.e., four digital-to-capacitance circuits each having 6 bits, or 6 capacitors. The results can be processed and combined properly to obtain a final result, i.e., the desired high precision analog output signal having the target coefficient resolution.

One skilled in the art would appreciate that segmentation can be done in a variety of ways. With segmentation, it is no longer required to add larger and larger capacitors to achieve higher resolution. The principle operation behind segmentation for a SATMULT is that for any multiplication, i.e., the function being provided by SATMULT 20 seen in FIG. 2, can be split into a number of weighted sub-operations. For example, a binary weighted digital-to-capacitance converter in a SATMULT can be split into segments in any of the power of 2 boundaries in the coefficient word, which can perform multiplications in parallel and independently. The outputs or results can be scaled or weighted accordingly and combined/summed to obtain a final result.

Figure 3:
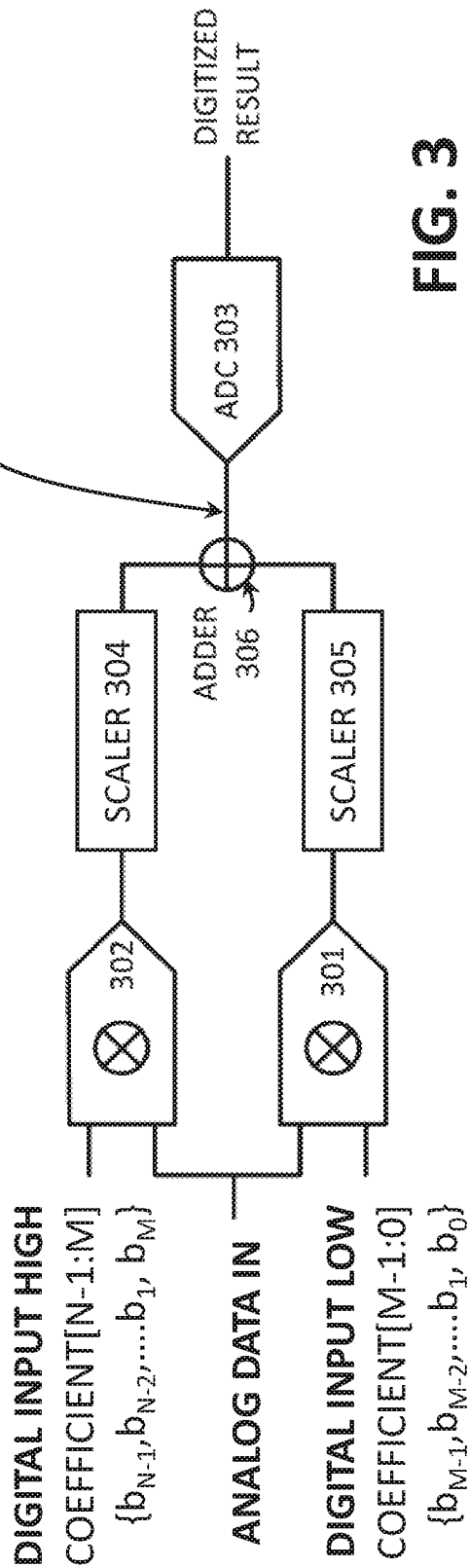
FIG. 3 shows a high-precision segmented sampled analog multiply circuit (SATMULT) having two or more parallel SATMULTs according to some embodiments of the disclosure, with a scaler in the analog domain, an adder, and an optional single downstream ADC.

FIG. 3 shows an embodiment according to the disclosure with a segmented SATMULT composed of two or more (only two are shown in the example for simplicity) SATMULT segments 301, 302. In this example, the target coefficient resolution is N. Both SATMULT segments receive the analog input data ("ANALOG DATA IN"). In this exemplary embodiment, the total set of bits of the coefficient COEFFICIENT[N−1:0] having $\{b_{N-1}, \ldots b_0\}$ may be split into two subsets of bits: COEFFICIENT[M−1:0] having a first subset of bits $\{b_{M-1}, b_{M-2}, \ldots b_1, b_0\}$ and COEFFICIENT[N−1:M] having a second subset of bits $\{b_{N-1}, b_{N-2}, \ldots b_1, b_M\}$. SATMULT segment 301 receives the COEFFICIENT[M−1:0], and SATMULT segment 302 receives COEFFICIENT[N−1:M]. The first subset $\{b_{M-1}, b_{M-2}, \ldots b_1, b_0\}$ represents the "low" coefficients switching the capacitors of the digital-to-capacitance circuit in SATMULT segment 301, and a second subset $\{b_{N-1}, b_{N-2}, \ldots b_1, b_M\}$ represents the "high" coefficients switching the capacitors of the digital-to-capacitance circuit in SATMULT segment 302. The SATMULT segment 301 multiplies the analog input data by a first segmented coefficient, i.e., COEFFICIENT[M−1:0]. The SATMULT segment 302 multiplies the analog input data by a second segmented coefficient, i.e., COEFFICIENT[N−1:M]. The number of bits in the two subsets may be identical, but may also be different, since segmentation can vary.

Results generated based on the SATMULT segments 301, 302 are combined in the analog domain through addition by adder 306. The combined result is optionally digitized by the ADC 303 to produce a digitized result of the analog input data multiplied by the coefficient COEFFICIENT[N−1:0].

As described above, a larger non-segmented SATMULT may be split or segmented into a plurality of (in the present example two) smaller SATMULT segments 301, 302. In a non-segmented SATMULT having a target coefficient resolution of N, capacitance values would be $1*C, 2*C, \ldots, 2^N*C$. In contrast, for a segmented SATMULT having the SATMULT segment 302 and 301, the capacitors in the digital-to-capacitance circuit of SATMULT segment 302 processing the "high" bits $\{b_M, b_{M+1}, \ldots b_{N-1}\}$ may have capacitance values $1*C, 2*C, \ldots, 2^{N-M-2}*C$, and the capacitors in the digital-to-capacitance circuit of SATMULT segment 301 may have capacitance values of $1*C, 2*C, \ldots, 2^{M}*C$. The capacitor representing the LSB in each SATMULT segment 301, 302 would have the capacitance of $1*C$. An erroneous result would be produced when the outputs from the SATMULT segments 301 and 302 are directly added in adder 306. To properly combine the outputs from the SATMULT segments 301 and 301, one or more outputs from the SATMULT segments can be scaled to arrive at a correct result.

In some embodiments, a scaler 305 downscales the output produced by SATMULT segment 301. In some embodiments, a scaler 304 can be provided to upscale the output produced by SATMULT segment 302. In some embodiments, a scaler may be used for both outputs if scaling is necessary to normalize the outputs from the segments to arrive at a correct result. Mathematically, segmentation and scaling for arriving at a correct result can be expressed by the following equations:

$$SATMULT_{SEG\_OUT} = \\ COEFFCIENT[SIGN] ** \left( \sum_{n=0}^{M-1} DATA*COEFFICIENT[n]*2^n + \left( \sum_{n=M}^{N-1} DATA*COEFFICIENT[n]*2^{n-M} \right) * 2^M \right) \quad (2)$$

$$SATMULT_{SEG\_OUT} = COEFFCIENT[SIGN] ** \\ \left( \left( \sum_{n=0}^{M-1} DATA*COEFFICIENT[n]*2^{n+M} \right) * 2^{-M} + \sum_{n=M}^{N-1} DATA*COEFFICIENT[n]*2^n \right) \quad (3)$$

In Equation (2), $\Sigma_{n=0}^{M-1}$ DATA*COEFFICIENT[n]*$2^n$ represents the output from the "low" SATMULT segment 301, and $\Sigma_{n=M}^{N-1}$ DATA*COEFFICIENT[n]*$2^{n-M}$ represents the output from the "high" SATMULT segment 302. The multiplier $2^M$ in equation (2) ensures that the output from the "high" SATMULT segment 302 is scaled up properly to arrive at a correct result.

In equation (3), $\Sigma_{n=0}^{M-1}$ DATA*COEFFICIENT[n]*$2^{n+M}$ represents the output from the "low" SATMULT segment 301, and $\Sigma_{n=M}^{N-1}$ DATA*COEFFICIENT[n]*$2^n$ represents the output from the "high" SATMULT segment 302. The multiplier $2^{-M}$ in equation (3) ensures that the output from the "low" SATMULT segment 302 is scaled down properly to arrive at a correct result.

The scaling factor for the scalers 304, 305 can correspond to the power of 2 boundary point of segmentation (which is $2^M$ in this example). The scaling factor being used can account for the capacitors in the segmented SATMULT no longer increasing from $1*C, 2*C, \ldots, 2^N*C$ to achieve the capacitance ratios for the target coefficient resolution of N.

Scaling of a signal based on a scaling factor can be performed in the analog domain. For instance, the scalers 304, 305 receiving the outputs from the SATMULT segments 302, 301 respectively may be implemented using sampled analog technology, as described for example in U.S. Pat. No. 8,547,272 which is incorporated herein by reference in its entirety. With a proper ratio of capacitances, charge sharing among switched capacitors can implement a signal scaling operation on the (analog) outputs from the outputs from the SATMULT segments 302, 301. In some cases, the scalers can be implemented with an amplifier.

Figure 4:
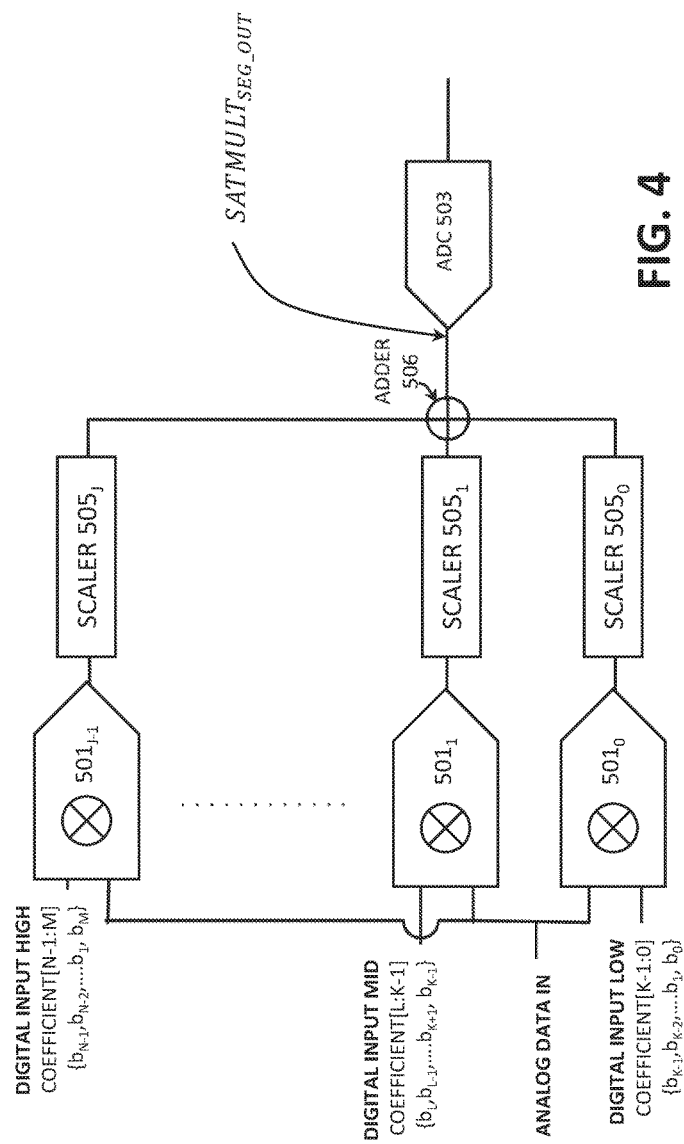
FIG. 4 shows a high-precision segmented sampled analog multiply circuit (SATMULT) according to some embodiments of the disclosure, with multiple segments each processing different subsets of coefficients, with respective scalers in the analog domain, an adder, and an optional single downstream ADC.

According to some embodiments, as illustrated in FIG. 4, the two segment SATMULT of FIG. 3 can be generalized to an embodiment with more than two SATMULT segments $501_0, 501_1, \ldots 501_{J-1}$. The "low" SATMULT $501_1$ receives the low bits of the coefficient, COEFFICIENT[K−1:0], e.g., $\{b_{K-1}, b_{K-2}, \ldots b_1, b_0\}$ and performs multiplication of the analog input data with the low bits of the coefficient. The "mid" SATMULT $501_2$ receives middle bits of the coefficients, COEFFICIENT[L:K−1], e.g., $\{b_L, b_{L-1}, \ldots b_{K+1}, b_{K-1}\}$ and performs multiplication of the analog input data with the low bits of the coefficient. The "high" SATMULT $501_N$ receiving the high bits of the coefficient, COEFFICIENT[K:N−1], e.g., $\{b_{N-1}, b_{N-2}, \ldots b_1, b_M\}$. The dotted vertical lines in FIG. 4 indicate that more than one SATMULT segments receiving (different sets of) middle bits may be provided. The (optional) scalers $505_1, \ldots, 505_{N-1}$ arranged before the adder 506 operate in a similar fashion as scalers 304 and 305 in FIG. 3. Depending on the capacitances in the digital-to-capacitance circuits of the SATMULT segments, the analog output from one or more SATMULT segments $501_0, 501_1, \ldots 501_{J-1}$, may be scaled by a scaler, e.g., shown as scalers $505_0, 505_1, \ldots 505_{J-1}$. In some embodiments, the outputs from the SATMULT segments receiving the less significant bits of the coefficients, e.g., outputs from segments $501_0, 501_1, \ldots 501_{J-2}$ (but not $501_{J-1}$) are scaled down by the corresponding scalers $505_0, 505_1, \ldots 505_{J-2}$. In some embodiments, the outputs from the SATMULT segments receiving the more significant bits of the coefficients, e.g., outputs from segments $501_1, 501_2, \ldots 501_{J-1}$ (but not $501_0$) are scaled down by the corresponding scalers $505_1, 505_2, \ldots 505_{J-1}$. A scaling factor for a given scaler is selected to arrive at a correct result for $SATMULT_{SEG\_OUT}$. Results generated based on the SATMULT segments $501_0, 501_1, \ldots 501_{J-1}$ are combined in the analog domain through addition by adder 506. An optional ADC 503 can be provided to digitize the result from adder 506 to generate a digitized result. The corresponding savings in chip area is significant since the area on the chip taken up by all of the capacitors of all SATMULT segments $501_0, \ldots,$ $501_{J-1}$ in the segmented design is drastically smaller than the area taken up by the capacitors in an unsegmented SATMULT.

Scaling and Adding in the Digital Domain

In the exemplary embodiments of FIGS. 3 and 4, scaling and adding are performed in the analog domain so that only a single, e.g., ADC 303 and ADC 503, is required to digitize the analog output signal.

Figure 5:
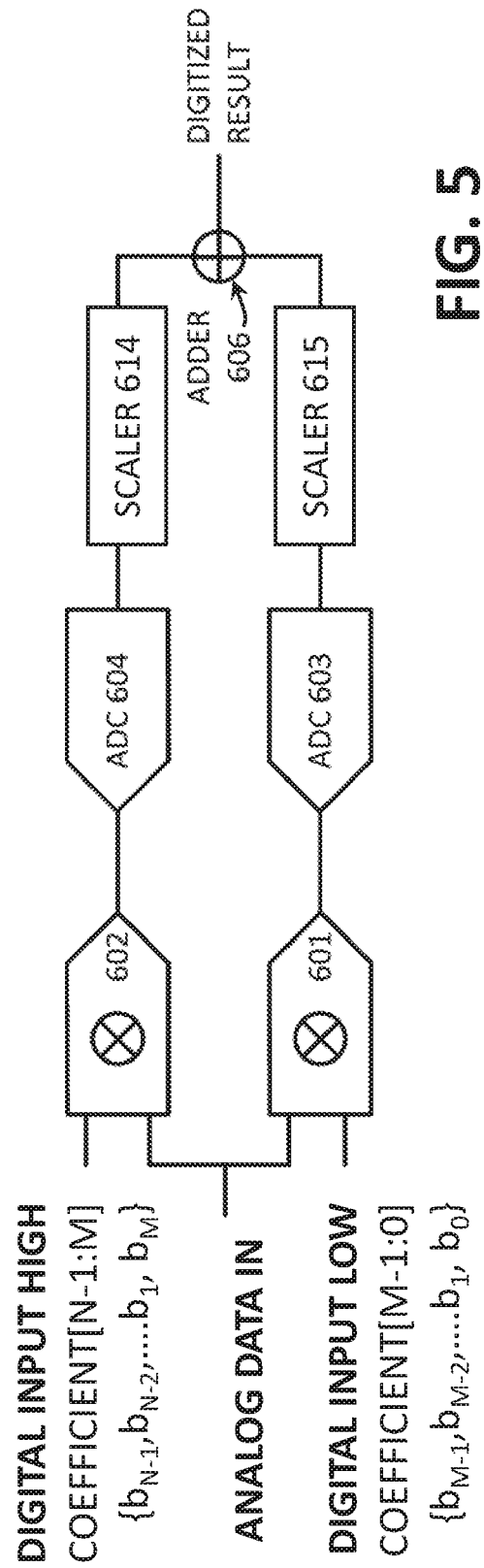
FIG. 5 shows a high-precision segmented sampled analog multiply circuit (SATMULT) according to some embodiments of the disclosure, with separate ADC's for each segment, and a digital scaler and an adder in the digital domain.

In alternative approach illustrated in FIG. 5, the scaling and the adding are performed in the digital domain. In FIG. 5, "low" SATMULT segment 601 receives the sampled analog signal (e.g., the analog input data "ANALOG DATA IN") and the low bits of the coefficient, COEFFICIENT[M−1:0], e.g., bits $\{b_{M-1}, b_{M-2}, \ldots b_1, b_0\}$. The "high" SATMULT segment 602 receives the sampled analog signal and the high bits of the coefficient, COEFFICIENT[M:N−1], e.g., bits $\{b_{N-1}, b_{N-2}, \ldots b_1, b_M\}$. The result or output from the "low" and "high" SATMULT segments 601, 602 are instead processed in the digital domain. The analog output from SATMULT segment 601 is digitized by ADC 603, and the analog output from SATMULT segment 602 is digitized by ADC 604.

Because the SATMULT segment 601 and the SATMULT segment 602 each have, like the SATMULT segments 301, 302 of FIG. 3, capacitance values starting with an LSB of 1*C, the output from ADC 604 must either be scaled in scaler 614 by a factor of $2^M$ (scaled up) or the output from ADC 603 must be scaled in scaler 615 by a factor of $2^{-M}$ (scaled down) before being added in adder 606. Upscaling and downscaling of the output bits from the respective ADC's 603, 604 can be accomplished by way of digital multiplication, e.g., by digitally shifting bits. Adding can also be performed in the digital domain.

Bit Slice Machine

As illustrated by the generalized embodiment in FIG. 4, the segmented design is scalable. One extreme is to design a segmented SATMULT having a target coefficient resolution of N as a bit-slice machine, shown in FIG. 6, where every segment (e.g., $801_0, 801_1, \ldots 801_{N-1}$) receives only one bit of the coefficient (e.g., $b_0, b_1, \ldots b_{N-1}$ respectively). The overall chip area taken up by the capacitors of the SATMULT segments of FIG. 6 may be reduced to approximately N.C. In this fashion, the digital-to-capacitance circuit in a SATMULT segment becomes a switch that either passes the sampled analog data ("ANALOG DATA IN") through unchanged, or passes a virtual (differential) ground ("GND (0)") depending on the coefficient being provided to the SATMULT segment.

The design includes (optional) scalers $804_0, 804_2, \ldots 804_{N-1}$ that scale the analog output values from SATMULT segments $801_0, 801_2, \ldots 801_{N-1}$. Depending on the scaling approach (scaling up or scaling down), the outputs from the SATMULT segments receiving the less significant bits of the coefficients, e.g., outputs from segments $801_0, 801_1, \ldots 801_{N-2}$ (but not $801_{N-1}$) are scaled down by the corresponding scalers $804_0, 804_1, \ldots 804_{N-2}$. In some embodiments, the outputs from the SATMULT segments receiving the more significant bits of the coefficients, e.g., outputs from segments $801_1, 801_2, \ldots 801_{N-1}$ (but not $801_0$) are scaled up by the corresponding scalers $804_1, 804_2, \ldots 804_{N-1}$. A scaling factor for a given scaler is selected to arrive at a correct result for $SATMULT_{SEG\_OUT}$. The scaling factor commensurates with the position of the bit $\{b_i\}$ in the set of bits of the coefficient $\{b_0, \ldots b_{N-1}\}$, e.g., by a factor $2^{-i}$, or $2^i$, where i is the index of the coefficient $b_i$. Upscaling or downscaling may be performed in accordance with the discussion of FIGS. 3 and 4. The scaled analog charge values are then summed in adder 806 before being optionally digitized in ADC 803 to arrive at a digitized output.

The SATMULT segments $801_0, 801_1, \ldots 801_{N-1}$ are shown here schematically as switches and may be designed as a so-called bit-slicer, wherein each SATMULT segment resolves only a single bit of the coefficient $\{b_i\}$. Each SATMULT segment has two (unillustrated) capacitors, one capacitor to store charge corresponding to DATA and another capacitor to connect the input to virtual (differential) ground. All capacitors of the SATMULT segments $801_0, 801_1, \ldots 801_{N-1}$ may have identical values (=1*C). The highly segmented design yields significant processing speed advantages since it is much faster to charge smaller capacitors, and the speed of computation of values required from input to output is reduced.

Designing for Output SNR and Resolution

Figure 7:
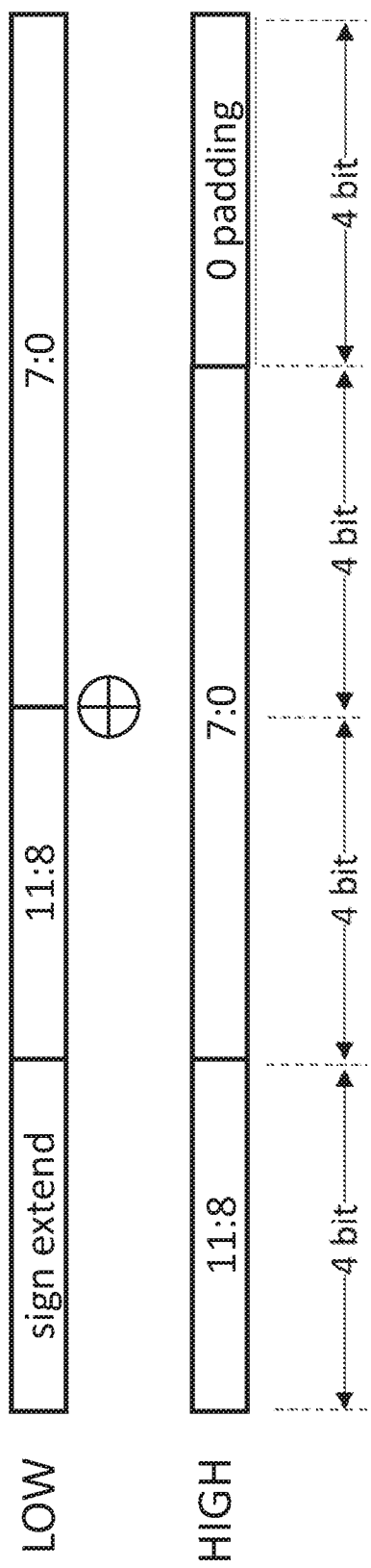
FIG. 7 illustrates combining outputs from two separate full-resolution ADC's according to the embodiment illustrated in FIG. 5.

According to some embodiments of the disclosure, as previously described and shown in FIG. 5, a larger SATMULT may be segmented into a "low" SATMULT segment 601 and a "high" SATMULT segment 602, with each segment processing a common analog data input signal ("ANALOG DATA IN") and a subset of the bits of the coefficient. The processed data input signals are then digitized in respective ADCs 603, 604. One or both digitized outputs may be scaled in accordance with the ratio of capacitances. Consider an exemplary segmented SATMULT with 8-bit coefficients, and assuming that the signal-to-noise ratio (SNR) the analog input data is also 8 bits, the highest level of information possible would be 8 bits (coefficients)+8 bits (data)=16 bits, requiring a 16-bit ADC for full resolution conversion. By splitting the 8-bit coefficient set into two 4-bit coefficient sets, the "high" ADC 604 requires 12-bit resolution (4-bit "high" coefficients+8-bit SNR of the analog data). For symmetry, the "low" ADC 603 can also have 12-bit resolution. In the example illustrated in FIG. 7, an ADC with 12-bit resolution may also be used for the "low" ADC 603 for sake of symmetry. As can be readily seen from the example in FIG. 7 in conjunction with FIG. 5, the digital addition in adder 606 is performed by adding the result from the "high" ADC 604 [11:0], with additional 4-bit zero padding (four "0" bits added at the end), to the result from the "low" ADC [11:0] with 4-bit zero sign extension (four "0" bits added at the front).

Figure 8:
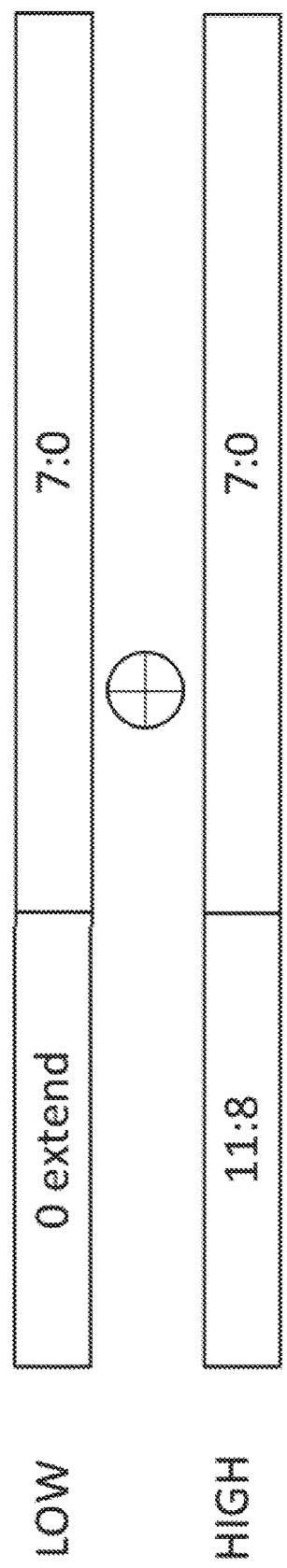
FIG. 8 illustrates combining outputs from a full-resolution "high" ADC and a low-resolution "low" ADC according to the embodiment illustrated in FIG. 5.

The above assumes that the combined output from the two SATMULT segments 601 and 602 requires full 16-bit resolution. In many situations, a lower overall resolution is sufficient, e.g. 12-bits instead of 16-bits. In this case the resolution of the "high" ADC would still need to be 12 bit. The "low" ADC has an 8 bit overlap with the "high" ADC, the remaining 4-bits would be truncated off in the scaler. Rather than using a 12 bit "high" ADC and a 12 bit "low" ADC, it is therefore possible to use a 12 bit "high" ADC and an 8 bit "low" ADC as illustrated in FIG. 8, resulting in reduced chip area and power consumption compared to the two full resolution ADC's of FIG. 7. Furthermore, using a lower resolution ADC for the "low" ADC may have a benefit over simple truncation of bits. By nature, an ADC provides an approximation of the analog input. Using a lower resolution ADC may have a cleaner "rounding" effect versus truncating the output bits of a higher resolution ADC.

High Precision Sampled Analog Finite Impulse Response (FIR) Filters

In more specific applications, the exemplary features described herein may be applied to other analog computations, for instance, computations that involve weighted sums of signal values. One such example implements a Finite Impulse Response (FIR) filter, which is a sum of weighted signal values at different time instants. A circuit for implementing a FIR filter would include delay elements, multiplication circuits for multiplying the coefficient corresponding to a given time instant in the filter with a signal value of that given time instant (provided as "ANALOG DATA IN"), and an adder or summation node for combining the products computed by the multiplication circuits. Such an FIR filter can thus be implemented using the segmented SATMULT described herein as the multiplication circuits. One skilled in the art would appreciate that other applications of the segmented SATMULT design are envisioned by the disclosure, as many signal processing operations or filters make use of multiplication. Applications having signal processing, such as audio applications, often use FIR filters. The described segmented SATMULT designs can be used to implement low power and small circuits for such applications. For instance, a low power audio processing device (e.g., a hearing aid) can greatly benefit from the high precision sampled analog segmented SATMULT designs. In another application, a handheld ultrasound wand can greatly benefit from the high precision sampled analog segmented SATMULT designs as well.

Compensating for Non-Linearity in the Digital Domain

In some examples, non-linearity caused by non-ideal capacitors in the digital-to-capacitance circuit needs to be addressed and/or compensated. Non-linearity from the digital-to-capacitance circuit can lead to non-linearity, i.e., distortions or errors, in the output of a SATMULT segment and the overall SATMULT circuit. In an ideal digital-to-capacitance circuit, transfer curve of the (digital) coefficient input to capacitance would be linear. Unfortunately due to the non-linear nature of capacitors in complementary metal-oxide semiconductor processes, the transfer curve is not linear. As a result, the non-linearity distorts or introduces an error to the sampled analog operation in which the digital-to-capacitance circuit is used.

Figure 9:
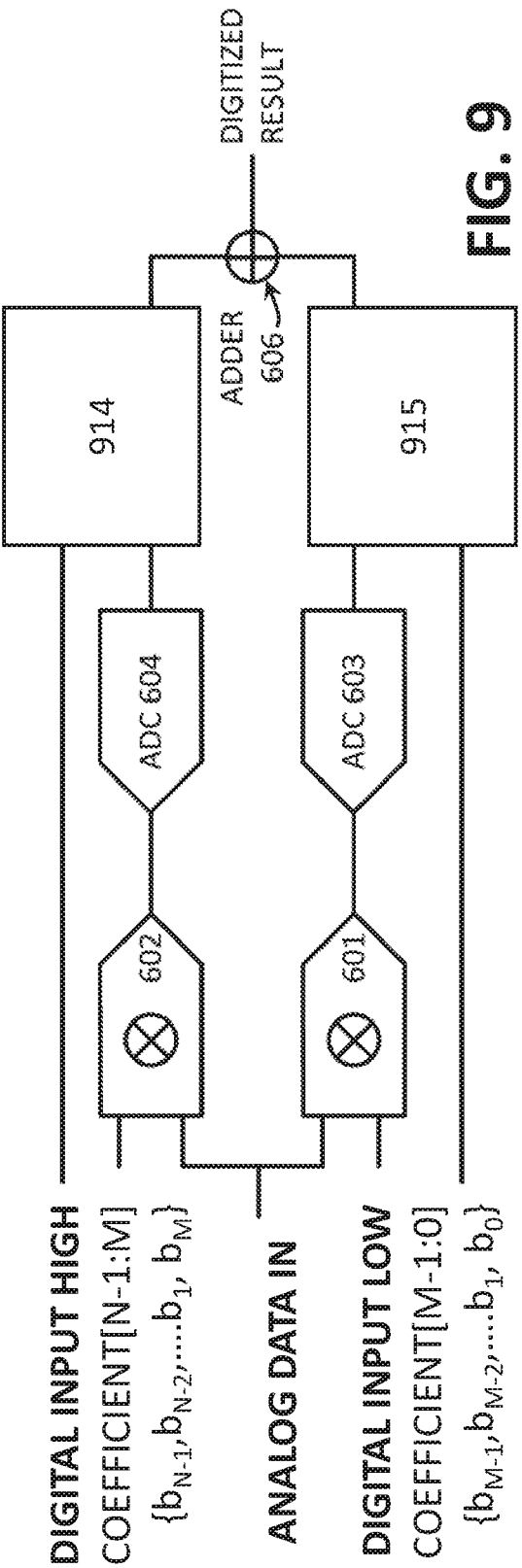
FIG. 9 shows a high-precision segmented sampled analog multiply circuit (SATMULT) according to some embodiments of the disclosure, with separate ADC's for each segment, and a digital scaler and an adder in the digital domain.

To compensate for the non-linearity, it is possible to determine a non-linear transfer function modeling the effect of the non-linearity of the digital-to-capacitance circuit in the SATMULT segments on the signal chain. An inverse of the non-linear transfer function can be used to correct or distort the results/outputs from the SATMULT segments and compensate for the effects of non-linearity of the digital-to-capacitance circuit. In some embodiments, the inverse of the non-linear transfer function can be implemented in the digital domain. As illustrated in FIG. 9, the inverse of the non-linear transfer function can be applied to the digital output from ADC 604 and 603. Depending on whether the outputs are being scaled up or scaled down, one or both blocks 914 and 915 can implement a scaling function to obtain a correct result. Furthermore, blocks 914 and 915 can implement post distortion, e.g., apply the inverse of the non-linear transfer function to correct for the effects of non-linearity. In some embodiments, the application of the inverse of the non-linear transfer function can be implemented as a look up table. A look up table can store correction values that can be used to correct the digital output signal from the ADC or corrected values which can be used to replace the digital output signal. The correction values or corrected values can correspond to the coefficient being provided as the digital input to the SATMULT segment. The look up table can also embed the scaling operation, if desired.

Neural Networks

Model neurons of a neural network have been implemented in hardware as electronic circuits. The basic computational element (model neuron) is often called a node or unit. It receives input from some other units, or perhaps from an external source. Multiple units can be arranged, for example, in form of a matrix and interconnected, forming a fairly sophisticated network of computations. Each unit compute weighted sum of the input(s) from other units:

$$\overrightarrow{out} = \|weights\| * \overrightarrow{in} \tag{4}$$

Weights can be modified so as to model synaptic learning. When looking at just one output vector element $out_j$ of $\overrightarrow{out}$, it can be seen that the computations involve multiple multiplications and a summation of all the products from the multiplications:

$$out_j = \sum_{i=1}^{M} weights_{j,i} * in_i \tag{5}$$

Figure 10:
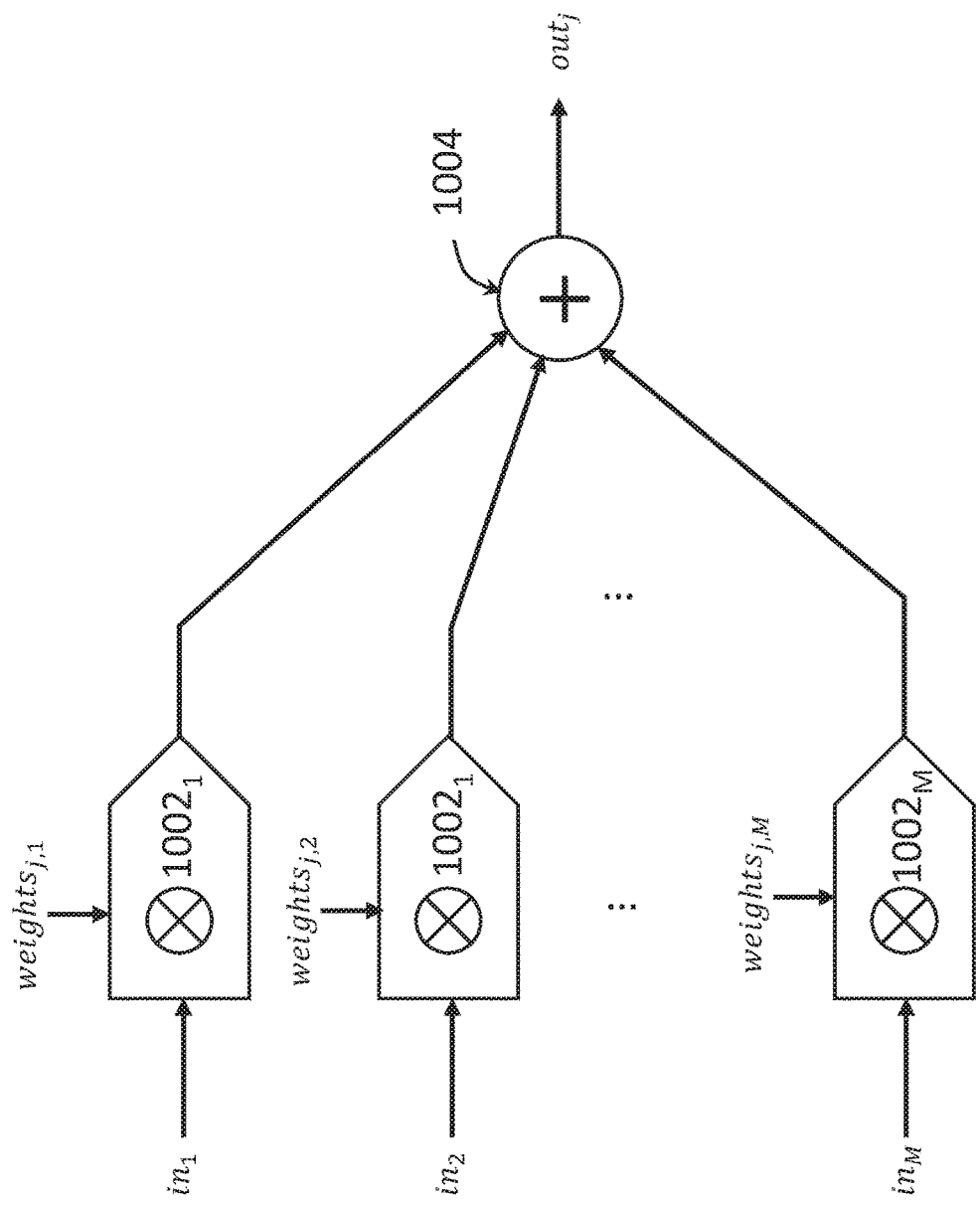
FIG. 10 shows a structure for computing one element of the output vector

For a neural network having many of these units interconnected together, one can understand that many multiplications would be performed serially and in parallel. The structure for carrying out the equation (5) to compute one output vector element $out_j$ is shown in FIG. 10. To implement a neural network machine, the multiplications being performed in equation (5) can be implemented by M parallel SATMULTs, shown as SATMULTs $1002_1$, $1002_1$, ... and $1002_M$ taking $in_i$ as different analog inputs (e.g., $in_1$, $in_2$, ... $in_M$) and different weights as respective coefficients (e.g., $weights_{jj,1}$, $weights_{jj,2}$, ... $weights_{jj,M}$) and a summation node 1004 for summing the outputs of the M parallel SATMULTs to generate $out_j$. Rather than receiving "ANALOG DATA IN" for all of the SATMULTs, each SATMULT receive respective analog inputs (e.g., $in_1$, $in_2$, ... $in_M$). Each one of the M parallel SATMULTs can be implemented using the segmented technique illustrated by, e.g., FIGS. 3-6, to implement and carry out multiplication efficiently. Many sets of these M parallel SATMULTs can be provided and configured to carry out the equation (4) shown above to implement a unit in the neural network. Furthermore, the units can be duplicated and coupled together in a suitable manner, resulting in a sampled analog neural network machine.

Figure 6:
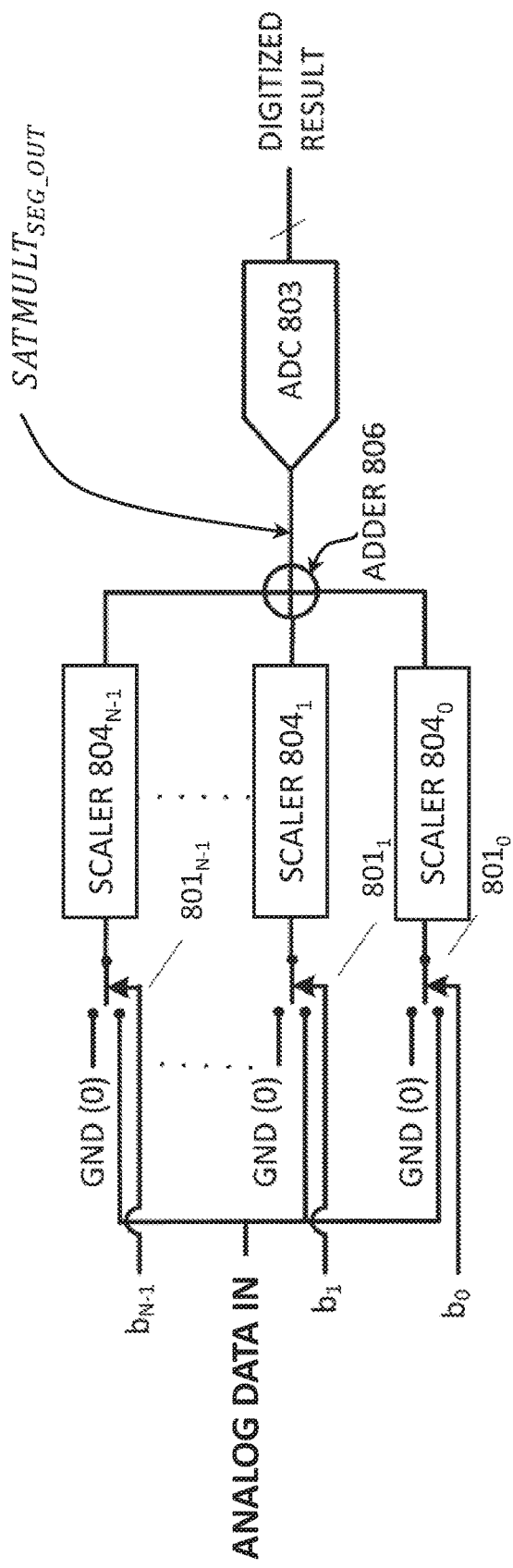
FIG. 6 shows a high-precision segmented sampled analog multiply circuit (SATMULT) according to some embodiments of the disclosure that is designed as a bit-slice SATMULT receiving common input data.
Figure 11:
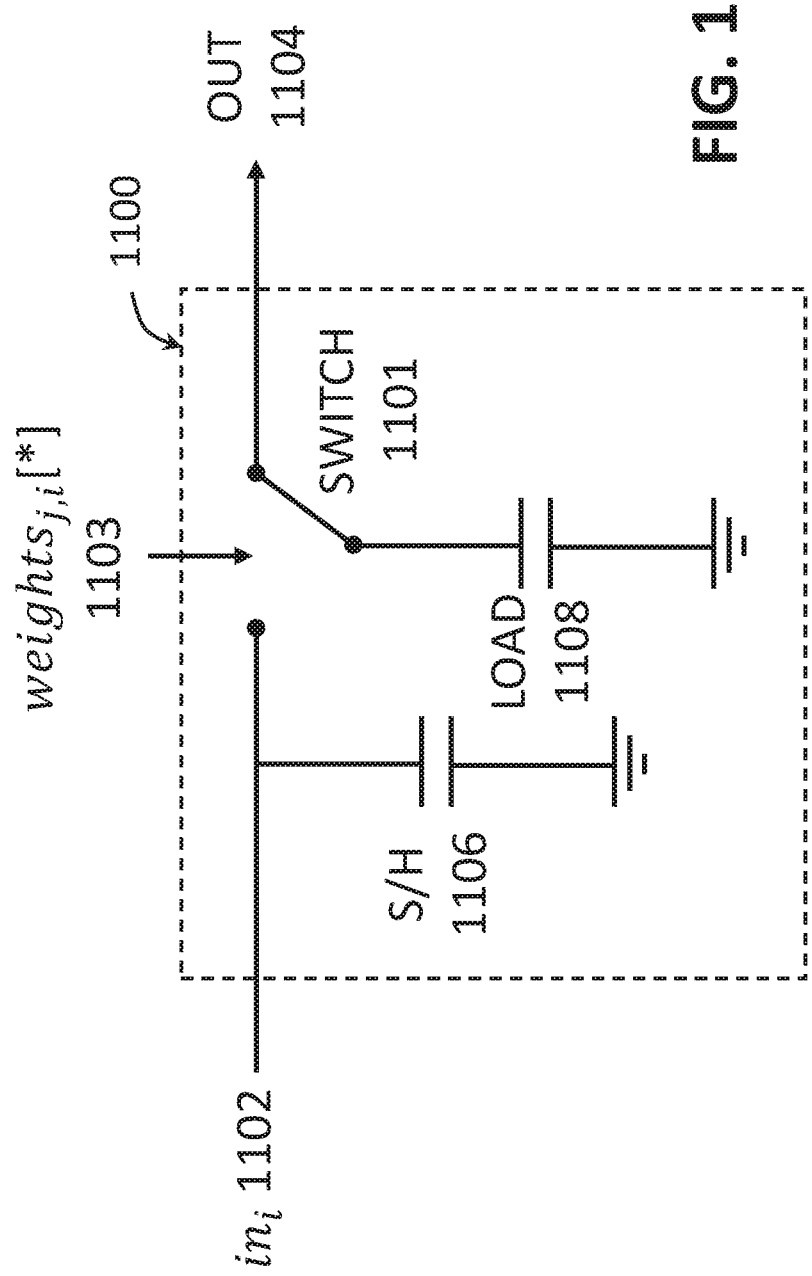
FIG. 11 shows an exemplary switch cell for implementing a neural network, according to some embodiments of the disclosure.

In one example, the bit slice SATMULT illustrated in FIG. 6 can be used as the multiplication circuits for performing multiplication of weights and inputs. By decomposing the weights, i.e., the coefficients, into single bit values, a SATMULT circuit can be implemented by switch cells. A switch cell receives an analog input signal ($in_i$) and the switch cell is controlled by a particular bit of a weight ($weights_{j,i}[*]$, where * denotes bit position). Any one of the SATMULTs seen in FIG. 10, can comprise a plurality of these switch cells. FIG. 11 shows an exemplary switch cell 1100 for implementing a neural network, according to some embodiments of the disclosure. The switch cell 1100 receives an analog input signal ($in_i$) and switch 1101 is controlled by a bit of the weight ($weights_{j,i}[*]$ 1103). The switch 1101 serves to pass the input at 1102 towards the output OUT 1104, depending on value of the bit of the weight ($weights_{j,i}[*]$). The switch cell 1100 may include sample and hold circuitry 1106 for sampling the analog input signal, and a load 1108. Many of the switch cells can be provided in parallel to receive the same analog input signal $in_i$ and different bits of the weight, $weights_{j,i}[*]$. The output OUT 1104 of a given switch cell can be fed towards a summation node so that all of the outputs from the parallel switch cells can be summed or combined together to form, e.g., $out_j$. The parallel switch cells can form one of the SATMULTs seen in FIG. 10. The same structure can be duplicated for other SATMULTs.

For some embodiments, the sample and hold circuitry 1106 is shared among the switch cells. In other words, one sample and hold circuitry is used for a plurality of switch cells. In some embodiments, each switch cell has its own corresponding sample and hold circuitry (not shared among switch cells). In such embodiments, the capacitor in the sample and hold circuitry 1106 may have the same capacitance as the capacitor is the load 1108.

Advantageously, the output network would see the same load for both cases of the weight, i.e., the bit weights$_{j,i}$(*) being a "1" or "0".

Figure 12:
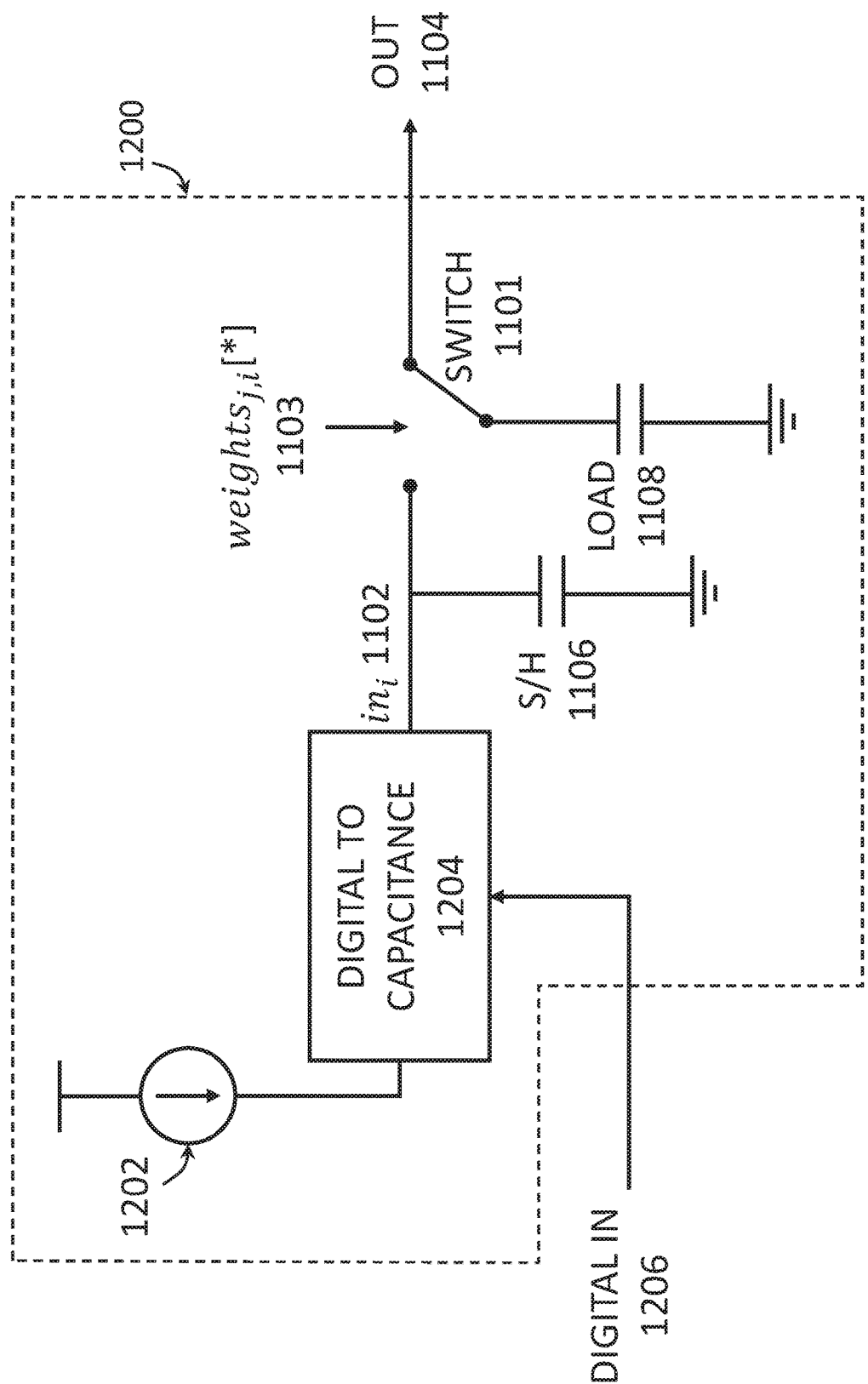
FIG. 12 shows an exemplary switch cell for implementing a neural network, wherein the switch cell receives a digital input, according to some embodiments of the disclosure.

The switch cell 1100 receives an analog input signal (in$_i$) at 1102. In some cases, the sample analog neural network machine not only receives the weights in digital form, the input signals are also in digital form. FIG. 12 shows an exemplary switch cell for implementing a neural network, wherein the switch cell receives a digital input, according to some embodiments of the disclosure. To accommodate receiving a digital input DIGITAL IN 1206, the switch cell 1200 can further include a current source 1202 coupled to a digital-to-capacitance circuit 1204 (similar to the one seen in FIG. 1). The capacitance provided by digital-to-capacitance circuit 1204 is controlled by the input signal in digital form, shown as DIGITAL IN 1206. The circuit effectively allows the input signal to be provided in digital form to be processed by the sampled analog circuits.

Variations, Examples and Implementations

Example 1 is a sampled analog circuit for processing an analog input signal based on a digital input signal, the sampled analog circuit comprising: a plurality of segments for processing the analog input signal and generating an output signal of the segment, each segment having a digital-to-capacitance circuit having a capacitance controlled by a subset of bits of the digital signal; at least one scaler, each scaler downstream from a corresponding segment for scaling a signal; and an adder combining results produced from the segments to generate an output signal of the sampled analog circuit.

In Example 2, Example 1 can optionally include the digital-to-capacitance circuit in each segment comprising a set of capacitors, and the sets of capacitors having a substantially identical set of capacitance values.

In Example 3, any one of the above Examples can optionally include the scaler downscaling the output signal from the segment.

In Example 4, any one of the above Examples can optionally include the scaler upscaling the output signal from the segment.

In Example 5, any one of the above Examples can optionally include the scaler scaling the signal based on a scaling factor corresponding to a power of 2 boundary point of segmentation with respect to subsets of bits of the digital signal received by the plurality of segments.

In Example 6, any one of the above Examples can optionally include an analog-to-digital converter (ADC) connected downstream of the adder.

In Example 7, any one of the above Examples can optionally include a plurality of analog-to-digital converters (ADCs) converting respective output signals of the segments into digital output signals, wherein the at least one scaler and the adder are implemented in digital domain.

In Example 8, any one of the above Examples can optionally include one of the ADCs having a lower resolution than another one of the ADCs.

In Example 9, any one of the above Examples can optionally include the subsets of bits having an identical number of bits.

In Example 10, any one of the above Examples can optionally include the subsets of bits having different numbers of bits.

In Example 11, any one of the above Examples can optionally include the subsets of bits each having only one bit.

In Example 12, any one of the above Examples can optionally include the segments multiplying the analog input signal by the digital input signal.

In Example 13, any one of the above Examples can optionally include at least one block for correcting effects of non-linearity, wherein a block applies an inverse of a non-linear transfer function associated with a segment.

In Example 14, any one of the above Examples can optionally include the scaler scaling the signal and correcting effects of non-linearity associated with the corresponding segment.

In Example 15, any one of the above Examples can optionally include the digital input signal being a filter coefficient of a filter processing the analog input signal.

In Example 16, any one of the above Examples can optionally include the digital input signal being a weight of a unit in a neural network and the analog input signal is an input from another unit in the neural network.

In Example 17, any one of the above Examples can optionally include a current source coupled to a digital-to-capacitance circuit controlled by a digital input signal to generate the analog input signal being processed by the plurality of segments.

Example 18 is a method for generating a filtered output signal from a sampled analog input signal, the method comprising: receiving a filter coefficient, wherein subsets of bits of the digital input signal controls respective digital-to-capacitance circuits; filtering the sampled analog input signal using the digital-to-capacitance circuits to generate output signals; scaling one or more ones of the output signals according to one or more respective scaling factors, wherein a scaling factor correspond to position of a subset of bits within the digital input signal controlling the digital-to-capacitance circuit used in generating the output signal being scaled; and adding one of the output signals and at least one scaled output signals to produce a filtered output signal.

In Example 19, any one of the above Examples can optionally include scaling one or more ones of the output signals comprising downscaling the one or more ones of the output signals, and the one or more ones of the output signals are generated using digital-to-capacitance circuits controlled by less significant bits of the filter coefficient.

In Example 20, any one of the above Examples can optionally include scaling one or more ones of the output signals comprising upscaling the one or more ones of the output signals, and the one or more ones of the output signals are generated using digital-to-capacitance circuits controlled by more significant bits of the filter coefficient.

In Example 21, any one of the above Examples can optionally include the output signals being digitized prior to the scaling and the adding.

In Example 22, any one of the above Examples can optionally include digitizing the filtered analog output signal.

Example 23 is an apparatus comprising: means for generate intermediate output signals based a sampled analog input signal comprising digital-to-capacitance circuits, each digital-to-capacitance circuit controlled by a subset of bits of the digital input signal; means for scaling one or more ones of the intermediate output signals; means for combining one or more scaled output signals and one of the intermediate output signals to produce the filtered output signal.

In Example 24, any one of the above Examples can optionally include the digital input signal being a filter coefficient of a finite impulse response filter filtering the sampled analog input signal.

In Example 25, any one of the above Examples can optionally include means for performing any one of the methods of Examples 18-22.

It should be noted that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures, illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A sampled analog circuit for processing an analog input signal based on a digital input signal, the sampled analog circuit comprising:
    a plurality of segments for processing the analog input signal and generating an output signal of the segment, each segment having a digital-to-capacitance circuit having a capacitance controlled by a subset of bits of the digital input signal;
    at least one scaler, each scaler being downstream from a corresponding segment for scaling a signal; and
    an adder combining results produced from the segments to generate an output signal of the sampled analog circuit.

2. The sampled analog circuit of claim 1, wherein the digital-to-capacitance circuit in each segment comprises a set of capacitors, and the sets of capacitors have a substantially identical set of capacitance values.

3. The sampled analog circuit of claim 1, wherein the scaler downscales the output signal from the corresponding segment.

4. The sampled analog circuit of claim 1, wherein the scaler upscales the output signal from the corresponding segment.

5. The sampled analog circuit of claim 1, wherein the scaler scales the signal based on a scaling factor corresponding to a power of 2 boundary point of segmentation with respect to subsets of bits of the digital input signal received by the plurality of segments.

6. The sampled analog circuit of claim 1, further comprising an analog-to-digital converter (ADC) connected downstream of the adder.

7. The sampled analog circuit of claim 1, further comprising a plurality of analog-to-digital converters (ADCs) converting respective output signals of the segments into digital output signals, wherein the at least one scaler and the adder are implemented in digital domain.

8. The sampled analog circuit of claim 7, wherein one of the ADCs has a lower resolution than another one of the ADCs.

9. The sampled analog circuit of claim 1, wherein the subsets of bits each have only one bit.

10. The sampled analog circuit of claim 1, wherein the segments multiplies the analog input signal by the digital input signal.

11. The sampled analog circuit of claim 1, further comprising at least one block for correcting effects of non-linearity, wherein a block applies an inverse of a non-linear transfer function associated with a segment.

12. The sampled analog circuit of claim 1, wherein the digital input signal is a weight of a unit in a neural network and the analog input signal is an input from another unit in the neural network.

13. The sampled analog circuit of claim 1, further comprising:
    a current source coupled to a digital-to-capacitance circuit controlled by a digital input signal to generate the analog input signal being processed by the plurality of segments.

14. A method for generating a filtered output signal from a sampled analog input signal, the method comprising:
- receiving a filter coefficient, wherein subsets of bits of a digital input signal controls respective digital-to-capacitance circuits;
- filtering the sampled analog input signal using the digital-to-capacitance circuits to generate output signals;
- scaling one or more ones of the output signals according to one or more respective scaling factors, wherein a scaling factor corresponds to a position of a subset of bits within the digital input signal controlling the digital-to-capacitance circuit used in generating the output signal being scaled; and
- adding one of the output signals and at least one scaled output signals to produce a filtered output signal.

15. The method of claim 14, wherein scaling one or more ones of the output signals comprises downscaling the one or more ones of the output signals, and the one or more ones of the output signals are generated using digital-to-capacitance circuits controlled by less significant bits of the filter coefficient.

16. The method of claim 14, wherein scaling one or more ones of the output signals comprises upscaling the one or more ones of the output signals, and the one or more ones of the output signals are generated using digital-to-capacitance circuits controlled by more significant bits of the filter coefficient.

17. The method of claim 14, wherein the output signals are digitized prior to the scaling and the adding.

18. The method of claim 14, further comprising digitizing the filtered output signal.

19. An apparatus comprising:
- means for generate intermediate output signals based on a sampled analog input signal comprising digital-to-capacitance circuits, each digital-to-capacitance circuit controlled by a subset of bits of a digital input signal;
- means for scaling one or more ones of the intermediate output signals; and
- means for combining one or more scaled output signals and one of the intermediate output signals to produce a filtered output signal.

20. The apparatus of claim 19, wherein the digital input signal is a filter coefficient of a finite impulse response filter filtering the sampled analog input signal.

* * * * *